United States Patent
King et al.

(10) Patent No.: US 12,431,194 B2
(45) Date of Patent: Sep. 30, 2025

(54) RESISTIVE RANDOM ACCESS MEMORY UNIT WITH ONE-WAY CONDUCTION CHARACTERISTIC AND FABRICATING METHOD THEREOF

(71) Applicant: NATIONAL TSING HUA UNIVERSITY, Hsinchu (TW)

(72) Inventors: Ya-Chin King, Hsinchu (TW); Chrong-Jung Lin, Hsinchu (TW); Yu-Cheng Lin, New Taipei (TW); Yao-Hung Huang, Tainan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 133 days.

(21) Appl. No.: 18/414,880

(22) Filed: Jan. 17, 2024

(65) Prior Publication Data

US 2025/0029655 A1    Jan. 23, 2025

(30) Foreign Application Priority Data

Jul. 21, 2023  (TW) ................. 112127445

(51) Int. Cl.
*G11C 11/00*   (2006.01)
*G11C 13/00*   (2006.01)

(52) U.S. Cl.
CPC ........ *G11C 13/004* (2013.01); *G11C 13/0038* (2013.01); *G11C 13/0069* (2013.01); *G11C 2013/0045* (2013.01); *G11C 2213/79* (2013.01)

(58) Field of Classification Search
CPC ............ G11C 13/0069; G11C 13/0004; G11C 13/0007; G11C 2213/79; G11C 2213/72
USPC .............................. 365/148, 185.18
See application file for complete search history.

(56) References Cited

U.S. PATENT DOCUMENTS

| | | | |
|---|---|---|---|
| 9,299,430 B1* | 3/2016 | Bertin | G11C 13/025 |
| 2013/0044532 A1* | 2/2013 | Bethune | G11C 13/003 |
| | | | 257/E45.001 |

* cited by examiner

*Primary Examiner* — Son T Dinh
(74) *Attorney, Agent, or Firm* — CKC & Partners Co., LLC

(57) ABSTRACT

A fabricating method of a resistive random access memory unit with one-way conduction characteristic includes performing an initializing step, a forming step and a reverse resetting step. The initializing step includes providing the resistive random access memory unit. The forming step includes applying a setting voltage on a lower metal layer, and coupling an upper metal layer to a ground voltage to transform the resistive random access memory unit to a low resistive state. The reverse resetting step includes coupling the lower metal layer to the ground voltage and applying a resetting voltage to the upper metal layer to transform the resistive random access memory unit to a one-way conduction state. A forward reading current is greater than a reverse reading current, and the forward reading current is less than 3000 times of the reverse reading current.

12 Claims, 10 Drawing Sheets

RESISTIVE RANDOM ACCESS MEMORY UNIT WITH ONE-WAY CONDUCTION CHARACTERISTIC AND FABRICATING METHOD THEREOF

RELATED APPLICATIONS

This application claims priority to Taiwan Application Serial Number 112127445, filed Jul. 21, 2023, which is herein incorporated by reference.

BACKGROUND

Technical Field

The present disclosure relates to a resistive random access memory unit and a fabricating method thereof. More particularly, the present disclosure relates to a resistive random access memory unit with one-way conduction characteristic and a fabricating method thereof.

Description of Related Art

The conventional resistive random access memory (RRAM) disposes an insulating layer between two electrodes, and the insulating layer has a conductive material. When a bias voltage is applied to the two electrodes, the conductive material of the insulating layer forms a conductive filament to let the two electrodes connect to each other conductively, and form a low resistance state (LRS). The resistive random access memory turns into a high resistance state (HRS) when a larger reset current is applied to the resistive random access memory, which is in a low resistance state. Therefore, the signal of the memory is determined to 0 or 1 by switching the resistive random access memory into the low resistance state or the high resistance state.

The aforementioned resistive random access memory is applied to Metal-Inductor-Metal (MIM) structure of the Complementary Metal-Oxide-Semiconductor (CMOS). By the miniature of the semiconductor process, the density of the memory array is increased. Hence, a sneak path current often generate in the crossbar array, and a misjudgment while reading the state of the memory may occurred. Moreover, the unselect memory cell may be interfered, and the storing state of the whole memory array may be affect.

Therefore, developing a resistive random access memory unit with one-way conduction characteristic and a fabricating method thereof, which can avoid the sneak path current, is commercially desirable.

SUMMARY

According to one aspect of the present disclosure, a fabricating method of a resistive random access memory unit with one-way conduction characteristic includes performing an initializing step, a forming step and a reverse resetting step. The initializing step includes providing the resistive random access memory unit. An original state of the resistive random access memory unit is a high resistive state. The resistive random access memory unit includes an upper metal layer, a via and a lower metal layer. The upper metal layer is connected to the via, and there is a gap between the lower metal layer and the via. The forming step includes applying a setting voltage on the lower metal layer, and coupling the upper metal layer to a ground voltage to transform the resistive random access memory unit from the high resistive state to a low resistive state. The reverse resetting step includes coupling the lower metal layer to the ground voltage and applying a resetting voltage to the upper metal layer to transform the resistive random access memory unit from the low resistive state to a one-way conduction state. When a reading voltage between the lower metal layer and the upper metal layer is greater than 0 V, a forward reading current flows through the lower metal layer, the via and the upper metal layer in sequence. When the reading voltage between the lower metal layer and the upper metal layer is less than 0 V, a reverse reading current flows through the upper metal layer, the via and the lower metal layer in sequence. The forward reading current is greater than the reverse reading current, and the forward reading current is less than 3000 times of the reverse reading current.

According to another aspect of the present disclosure, a resistive random access memory unit with one-way conduction characteristic includes an upper metal layer, a via and a lower metal layer. The via is connected to the upper metal layer. There is a gap between the lower metal layer and the via. When a setting voltage is applied to the lower metal layer and the upper metal layer is coupled to a ground voltage, the resistive random access memory unit is transformed from a high resistive state to a low resistive state. When the lower metal layer is coupled to the ground voltage and a resetting voltage is applied to the upper metal layer, the resistive random access memory unit is transformed from the low resistive state to a one-way conduction state. When a reading voltage between the lower metal layer and the upper metal layer is greater than 0 V, a forward reading current flows through the lower metal layer, the via and the upper metal layer in sequence. When the reading voltage between the lower metal layer and the upper metal layer is less than 0 V, a reverse reading current flows through the upper metal layer, the via and the lower metal layer in sequence. The forward reading current is greater than the reverse reading current, and the forward reading current is less than 3000 times of the reverse reading current.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
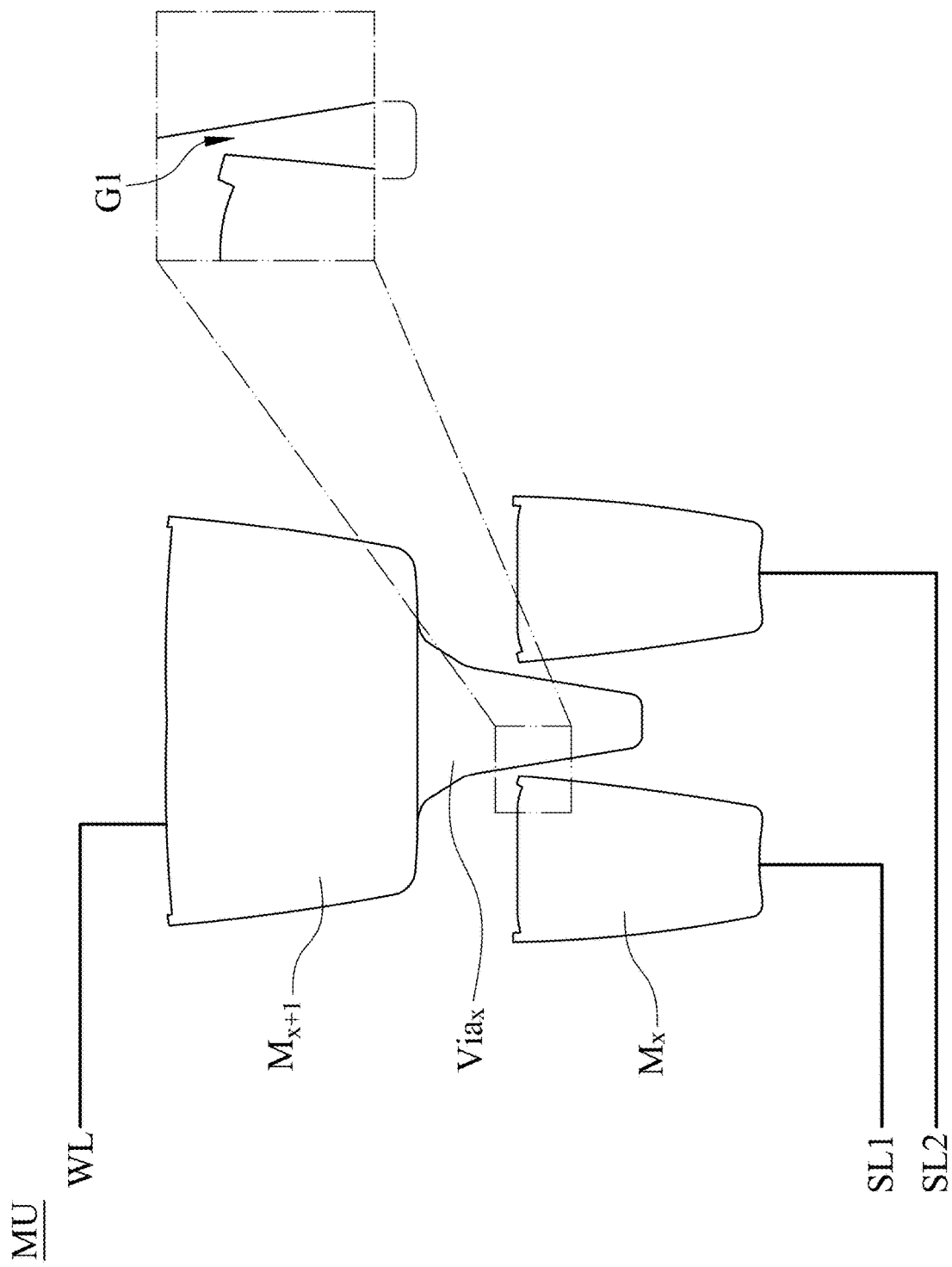
FIG. 1 shows a schematic view of a resistive random access memory unit with one-way conduction characteristic according to a first embodiment of the present disclosure.

Please refer to FIG. 1. FIG. 1 shows a schematic view of a resistive random access memory unit MU with one-way conduction characteristic according to a first embodiment of the present disclosure. The resistive random access memory unit MU with one-way conduction characteristic includes an upper metal layer $M_{x+1}$, a via $Via_x$ and a lower metal layer $M_x$. The via $Via_x$ is connected to the upper metal layer $M_{x+1}$. There is a gap G1 between the lower metal layer $M_x$ and the via $Via_x$.

In detail, the resistive random access memory unit MU can be a via type resistive random access memory, which is formed in the gap G1 between a metal layer and a via of the CMOS. The upper metal layer $M_{x+1}$ of the resistive random access memory unit MU is electrically connected to a word line WL. The two lower metal layers $M_x$, which form the gaps G1 with the via $Via_x$, are electrically connected to the source lines SL1, SL2. The gap G1 can be an oxide layer, and the gap G1 can be greater than or equal to 26 nm, and less than or equal to 30 nm.

Due to the two terminals of the gap G1 have different structures (a terminal of the gap G1 is connected to the via $Via_x$, to connected to the upper metal layer $M_{x+1}$, and the other terminal of the gap G1 is the lower metal layer $M_x$), the oxygen in the resistive random access memory unit MU has an asymmetrical distribution characteristic in the resistive switching layer. When a bias is applied to the two terminals of the resistive random access memory unit MU to form a conductive filament, the conductive filament also has an asymmetrical characteristic, and the asymmetrical characteristic will be more obvious while a width of the oxide layer (i.e., the gap G1) is increased. By the following reverse operation, the resistive random access memory unit MU transforms into a one-way conduction state. Thus, the resistive random access memory unit MU with one-way conduction characteristic of the present disclosure can have the one-way conduction characteristic by enlarging the gap G1 between the via $Via_x$ and the lower metal layer $M_x$.

Figure 2:
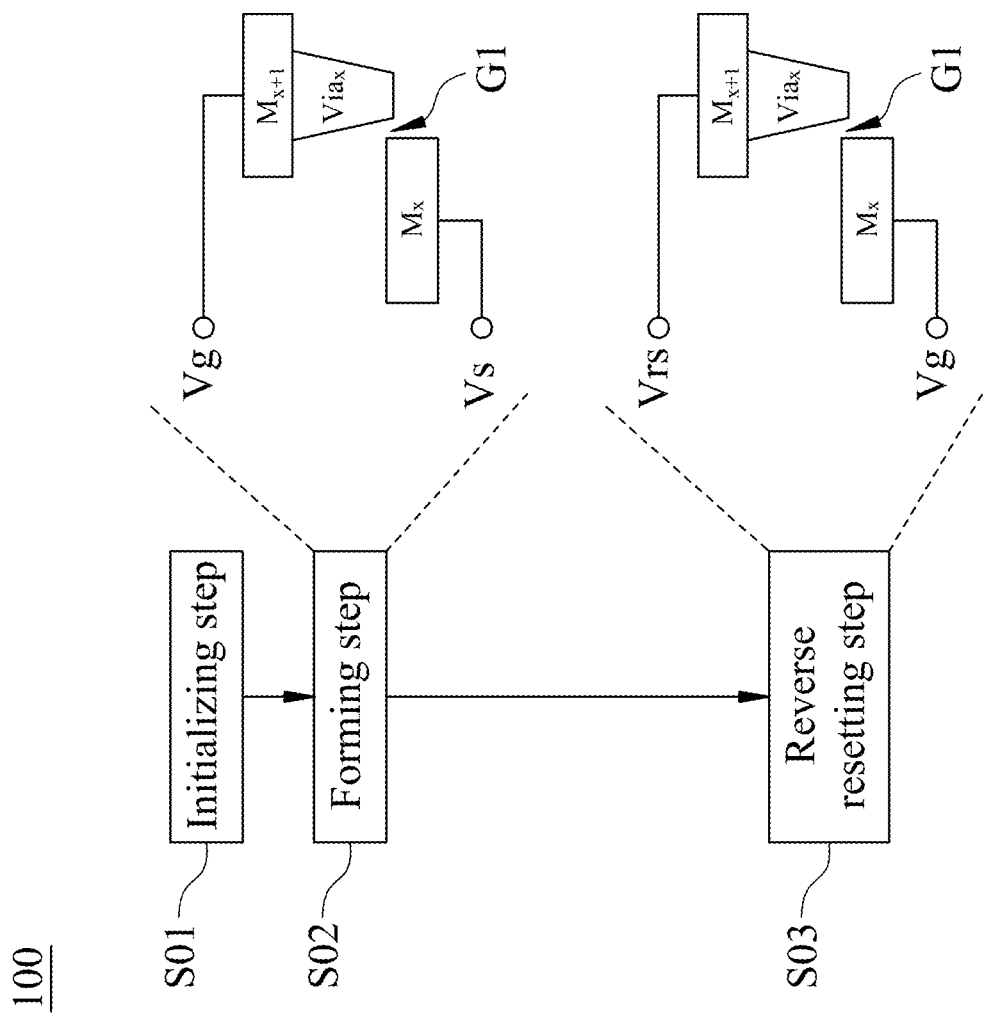
FIG. 2 shows a flow chart of a fabricating method of a resistive random access memory unit with one-way conduction characteristic according to a second embodiment of the present disclosure.
Figure 3:
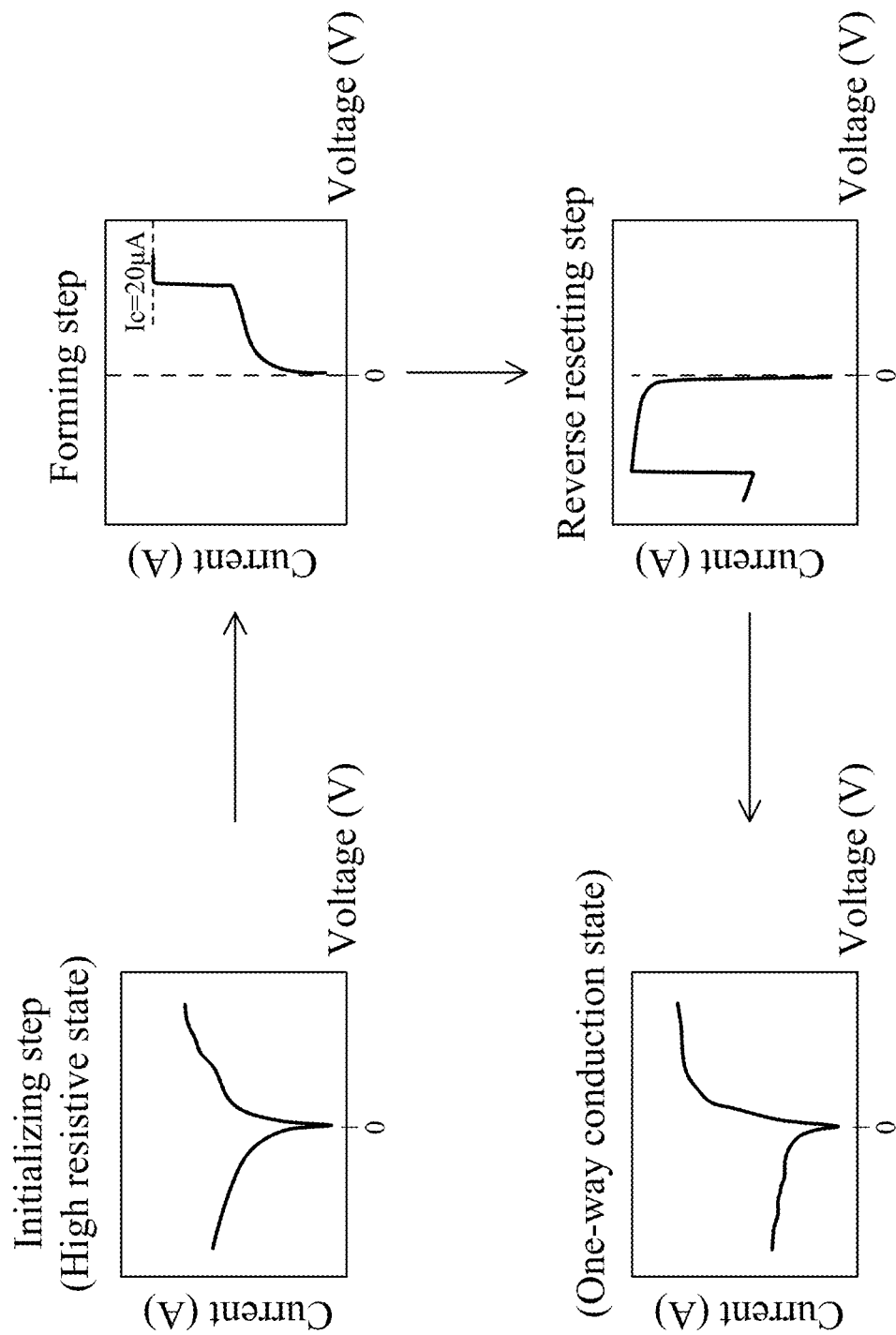
FIG. 3 shows a voltage-current characteristic schematic view of each of the steps in the fabricating method of the resistive random access memory unit with one-way conduction characteristic of FIG. 2.
Figure 5:
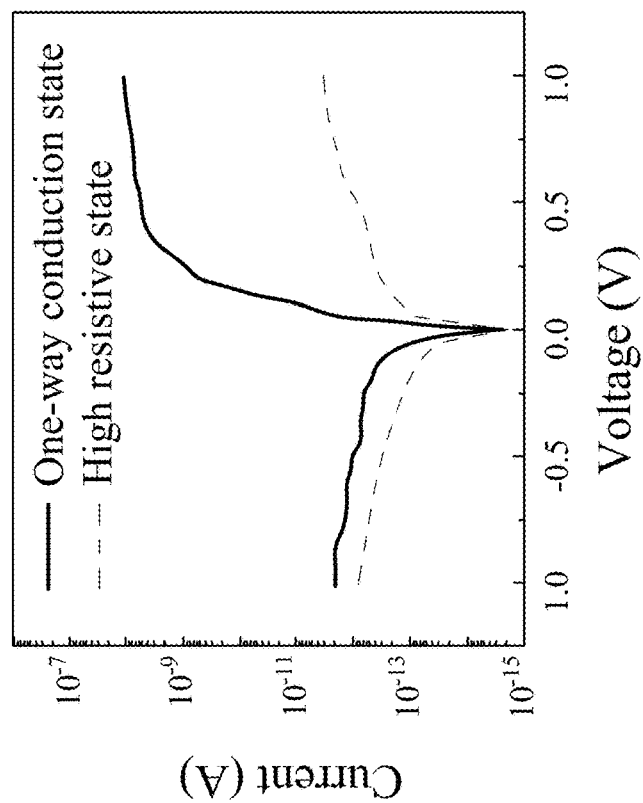
FIG. 5 shows a voltage-current characteristic schematic view compared between a high resistive state and a low resistive state of the fabricating method of the resistive random access memory unit with one-way conduction characteristic of FIG. 2.
Figure 4:
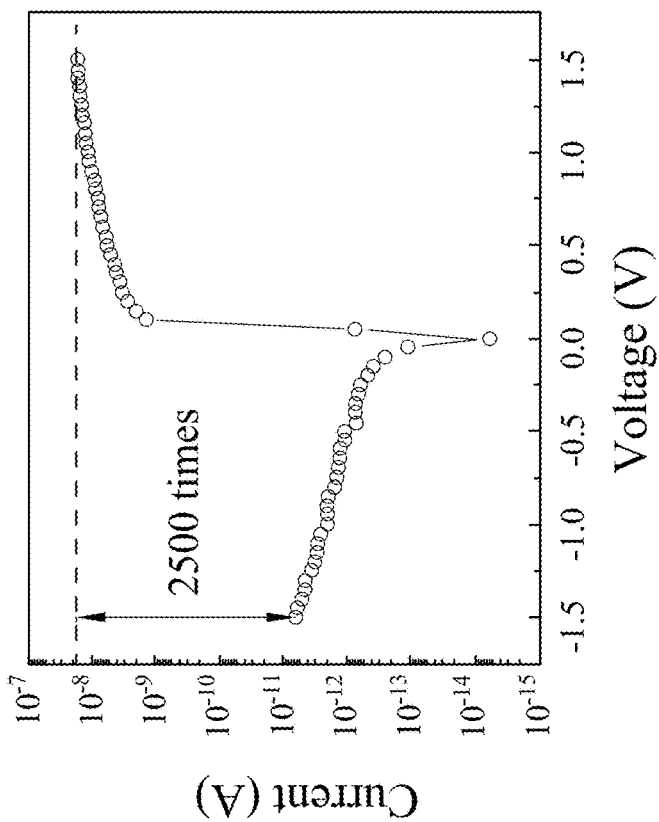
FIG. 4 shows a voltage-current characteristic schematic view of a one-way conduction state of the fabricating method of the resistive random access memory unit with one-way conduction characteristic of FIG. 2.

Please refer to FIG. 1 to FIG. 5. FIG. 2 shows a flow chart of a fabricating method 100 of a resistive random access memory unit MU with one-way conduction characteristic according to a second embodiment of the present disclosure. FIG. 3 shows a voltage-current characteristic schematic view of each of the steps in the fabricating method 100 of the resistive random access memory unit MU with one-way conduction characteristic of FIG. 2. FIG. 4 shows a voltage-current characteristic schematic view of a one-way conduction state of the fabricating method 100 of the resistive random access memory MU unit with one-way conduction characteristic of FIG. 2. FIG. 5 shows a voltage-current characteristic schematic view compared between a high resistive state and a low resistive state of the fabricating method 100 of the resistive random access memory unit MU with one-way conduction characteristic of FIG. 2. The fabricating method 100 of the resistive random access memory unit MU with one-way conduction characteristic includes performing an initializing step S01, a forming step S02 and a reverse resetting step S03. The initializing step S01 includes providing the resistive random access memory unit MU. An original state of the resistive random access memory unit MU is a high resistive state. The forming step S02 includes applying a setting voltage Vs on the lower metal layer $M_x$, and coupling the upper metal layer $M_{x+1}$ to a ground voltage Vg to transform the resistive random access memory unit MU from the high resistive state to a low resistive state. The reverse resetting step S03 includes coupling the lower metal layer $M_x$ to the ground voltage Vg and applying a resetting voltage Vrs to the upper metal layer $M_{x+1}$ to transform the resistive random access memory unit MU from the low resistive state to a one-way conduction state.

In detail, a voltage difference is between the lower metal layer $M_x$ and the upper metal layer $M_{x+1}$. The resistive random access memory unit MU provided by the initializing step S01 can be the same as the resistive random access memory unit MU in the first embodiment, but the present disclosure is not limited thereto. When the resistive random access memory unit MU is at the high resistive state, the resistive random access memory unit MU has a two-way conduction characteristic, and is shown in the voltage-current characteristic schematic view of the initializing step S01 in FIG. 3. No matter the voltage difference between the two terminals of the resistive random access memory unit MU is greater than 0 V or less than 0 V, the resistive random access memory unit MU is conductive.

In the forming step S02, the voltage difference (the setting voltage Vs– the ground voltage Vg) between the lower metal layer $M_x$ and the upper metal layer $M_{x+1}$ is greater than 0 V, the ground voltage can be 0 V, the setting voltage Vs can be greater than or equal to 4 V, and less than or equal to 6 V, but the present disclosure is not limited thereto. The current flowing through the lower metal layer $M_x$ and the upper metal layer $M_{x+1}$ and the voltage applied to the lower metal layer $M_x$ and the upper metal layer $M_{x+1}$ are corresponding to the voltage-current characteristic schematic view of the forming step S02 in FIG. 3.

Moreover, the forming step S02 can include performing a current limiting step. The current limiting step includes electrically connecting the resistive random access memory unit MU to a current limiting unit, when an output current of the resistive random access memory unit MU is greater than an upper limiting current Ic, the current limiting unit provides the upper limiting current Ic. The upper limiting current Ic is less than or equal to 20 μA. In the second embodiment, the upper limiting current Ic is 20 μA, but the present disclosure is not limited thereto. In detail, the current limiting unit can limit the output current by an external current limiting circuit, the current limiting unit is configured to detect the output current flowed through the lower metal layer $M_x$, the via $Via_x$ and the upper metal layer $M_{x+1}$, and restrict the output current to be the upper limiting current Ic when the output current is larger than the upper limiting current Ic. The current limiting unit can avoid a problem of the conductive filament being unable to reset because of breakdown of the gap G1.

In the reverse resetting step S03, the voltage difference (the ground voltage Vg– the resetting voltage Vrs) between the lower metal layer $M_x$ and the upper metal layer $M_{x+1}$ is less than 0 V, the ground voltage Vg can be 0 V, the resetting voltage Vrs can be greater than or equal to 2 V, and less than or equal to 3 V, but the present disclosure is not limited thereto. The voltage applied to the lower metal layer $M_x$ and the upper metal layer $M_{x+1}$ and the current flowing through the lower metal layer $M_x$ and the upper metal layer $M_{x+1}$ are corresponding to the voltage-current characteristic schematic view of the reverse resetting step S03 in FIG. 3.

When the resistive random access memory unit MU is at the one-way conduction state. The current flowing through the lower metal layer $M_x$ and the upper metal layer $M_{x+1}$ and the voltage applied to the lower metal layer $M_x$ and the upper metal layer $M_{x+1}$ are corresponding to the voltage-current characteristic schematic view of the one-way conduction state in FIG. 3, and is also shown in FIG. 4. When a reading voltage Vm (shown in FIG. 8A and FIG. 8B) between the lower metal layer $M_x$ and the upper metal layer $M_{x+1}$ is greater than 0 V, a forward reading current If (shown in FIG. 10) flows through the lower metal layer $M_x$, the via $Via_x$ and the upper metal layer $M_{x+1}$ in sequence. When the reading voltage Vm between the lower metal layer $M_x$ and the upper metal layer $M_{x+1}$ is less than 0 V, a reverse reading current Ir (shown in FIG. 7) flows through the upper metal layer $M_{x+1}$, the via $Via_x$ and the lower metal layer $M_x$ in sequence. In other words, when the reading voltage Vm is greater than 0.5 V, the forward reading current If flowing through the resistive random access memory unit MU is between $10^{-9}$ A and $10^{-8}$ A. When the reading voltage Vm is less than –0.5 V, the reverse reading current Ir flowing through the resistive random access memory unit MU is between $10^{-13}$ A and $10^{-11}$ A. The forward reading current If is greater than the reverse reading current Ir, and the forward reading current If is less than 3000 times of the reverse reading current Ir. Further, the forward reading current If can be greater than 2000 times of the reverse reading current Ir, and less than 2500 times of the reverse reading current Ir. In the second embodiment, when the reading voltage Vm is 1.5 V, the forward reading current If, which is generated while a positive voltage is applied from the lower metal layer $M_x$ to the upper metal layer $M_{x+1}$, is about 2500 times of the reverse reading current Ir, which is generated while a positive voltage is applied from the upper metal layer $M_{x+1}$ to the lower metal layer $M_x$, that is, when the resistive random access memory unit MU is at the one-way conduction state, the forward reading current If is much larger than the reverse reading current Ir. When the reading voltage Vm is less than 0 V, the reverse reading current Ir is extremely small, hence, the resistive random access memory unit MU can be viewed as unable to conduct. In FIG. 5, when the resistive random access memory unit MU is at the one-way conduction state, the forward reading current If is much larger than a forward reading current If at the high resistive state.

Thus, the fabricating method 100 of the resistive random access memory unit MU with one-way conduction characteristic of the present disclosure can be used as a diode structure in a memory array to ensure that the memory unit can be read, written and clear in single direction, and avoid a sneak path current occurred by being read in two directions, therefore, the reading accuracy and stability of the memory array can be increased.

Figure 6B:
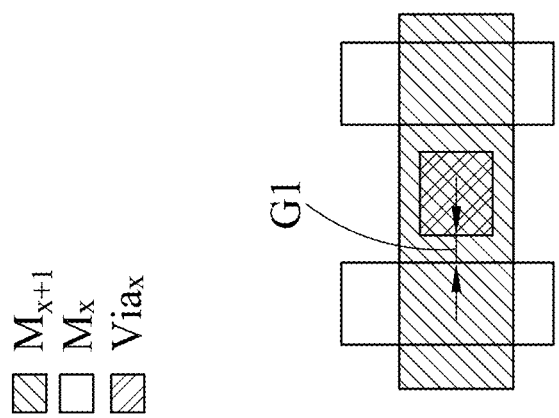
FIG. 6B shows a top view of the resistive random access memory unit with one-way conduction characteristic of FIG. 6A.
Figure 6A:
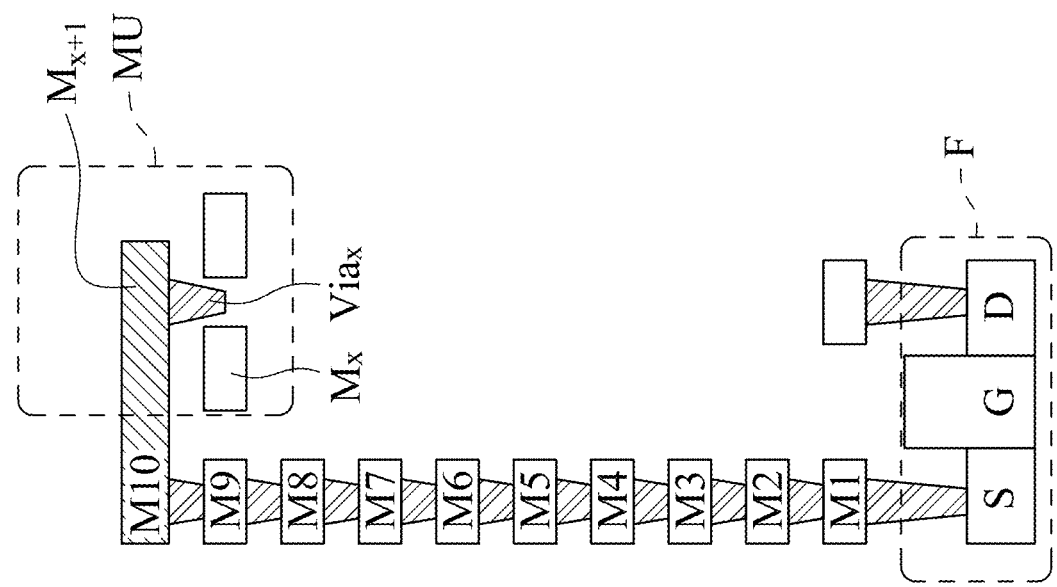
FIG. 6A shows a schematic view of a resistive random access memory unit with one-way conduction characteristic according to a third embodiment of the present disclosure.
Figure 6C:
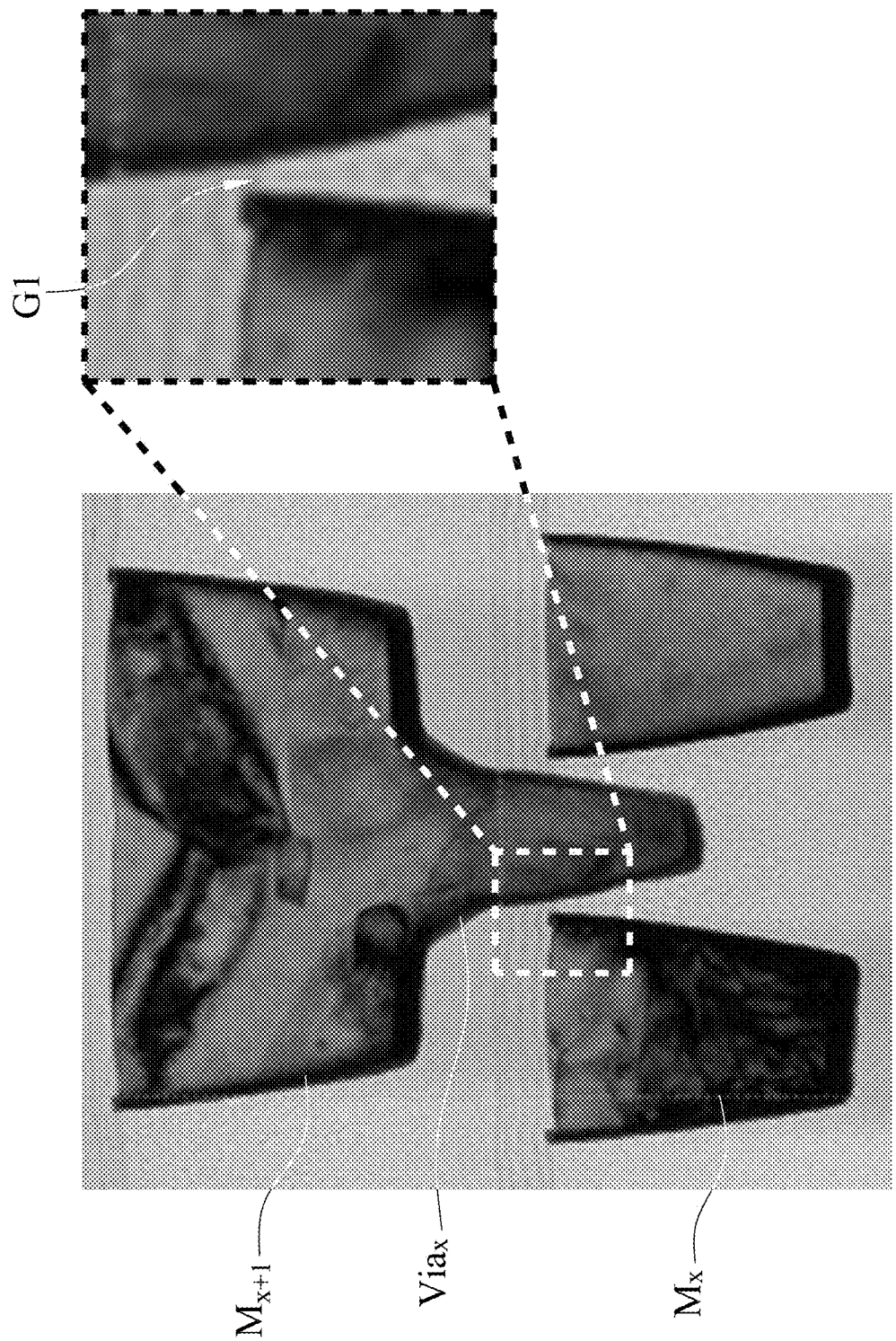
FIG. 6C shows a Transmission Electron Microscope (TEM) image of the resistive random access memory unit with one-way conduction characteristic of FIG. 6A.

Please refer to FIG. 6A, FIG. 6B and FIG. 6C. FIG. 6A shows a schematic view of a resistive random access memory unit MU with one-way conduction characteristic according to a third embodiment of the present disclosure. FIG. 6B shows a top view of the resistive random access memory unit MU with one-way conduction characteristic of FIG. 6A. FIG. 6C shows a TEM image of the resistive random access memory unit MU with one-way conduction characteristic of FIG. 6A. In the third embodiment, the resistive random access memory unit MU can be the same as the resistive random access memory unit MU in the first embodiment, and will not be described again. In particular, the resistive random access memory unit MU can be stacked on a Fin Field-Effect Transistor (FinFET) of a CMOS. The CMOS includes a plurality of metal layers M1, M2, M3, M4, M5, M6, M7, M8, M9, M10, the upper metal layer can be a 10th metal layer (i.e., the metal layer M10) of the CMOS, and the lower metal layer can be a 9th metal layer (i.e., the metal layer M9) of the CMOS. The FinFET F can include a source electrode S, a gate electrode G and a drain electrode D. Due to a shape of the via $Via_x$ of the metal layer M10 thinner than other metal layers M1, M2, M3, M4, M5, M6, M7, M8, the gap G1 between the via $Via_x$ and the metal layer M9 is wider. Thus, the resistive random access memory unit MU with one-way conduction characteristic of the present disclosure can configure the metal layer M10, the via $Via_x$ and the metal layer M9 as the upper metal layer $M_{x+1}$, the via $Via_x$ and the lower metal layer $M_x$ of the resistive random access memory unit MU to obtain an obvious one-way conduction characteristic.

Figure 7:
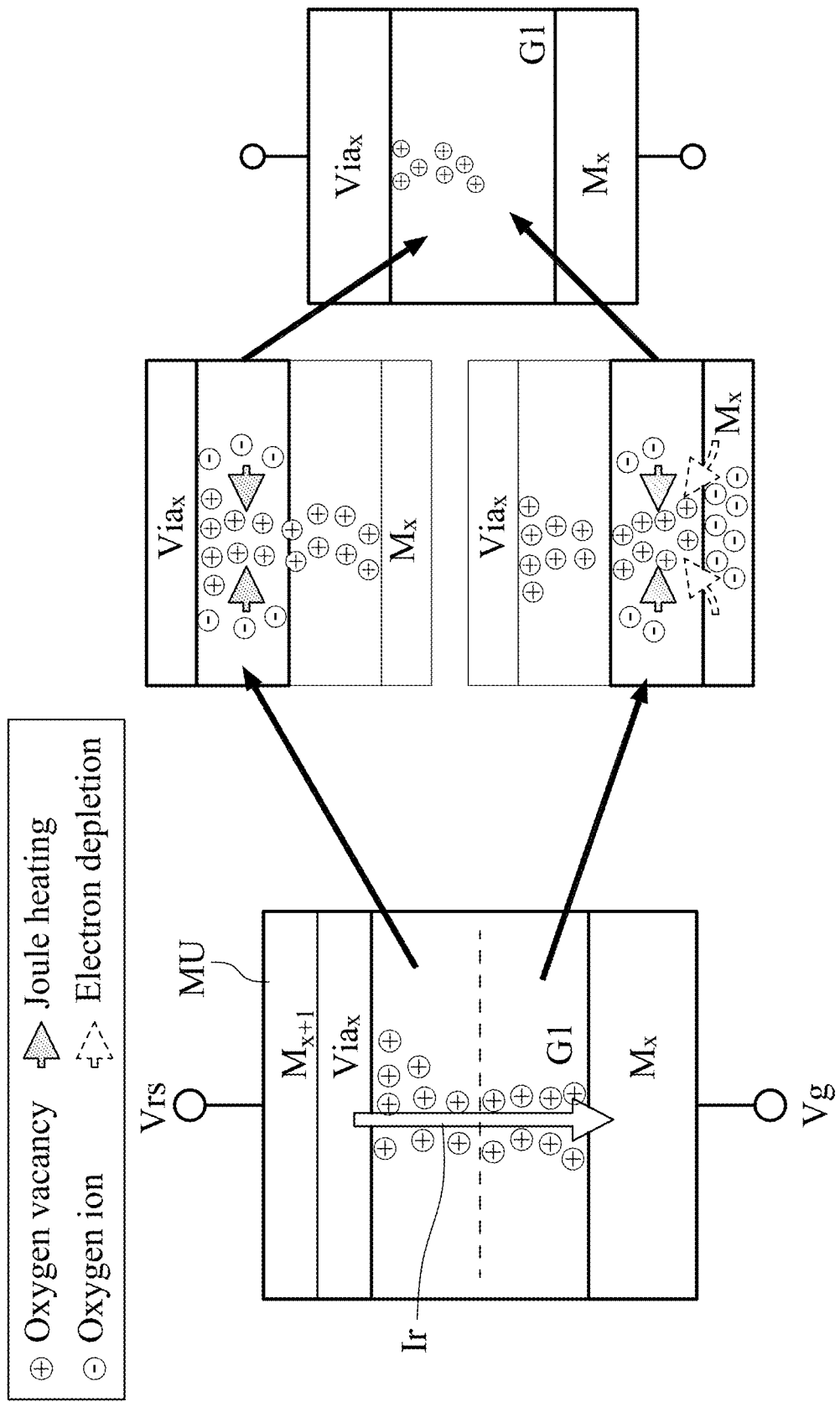
FIG. 7 shows a forming schematic view of a conductive filament of the resistive random access memory unit with one-way conduction characteristic of FIG. 6A.

Please refer to FIG. 2, FIG. 6A to FIG. 7. FIG. 7 shows a forming schematic view of a conductive filament of the resistive random access memory unit MU with one-way conduction characteristic of FIG. 6A. In FIG. 7, a schematic view of the resistive random access memory unit MU transformed to the low resistive state by the forming step S02 is on the left side. The via $Via_x$ and the lower metal layer $M_x$ are made of copper (Cu), which is conductive. The gap G1 between the via $Via_x$ and the lower metal layer $M_x$ is insolation oxide layer, and has a conductive filament formed by oxygen vacancy ($Vo^{2+}$). Because the structure of the resistive random access memory unit MU is asymmetrical (a terminal of the resistive random access memory unit MU is the via $Via_x$, and the other terminal of the resistive random access memory unit MU is the lower metal layer $M_x$), the oxygen vacancies are stacked in an upper portion of the gap G1. If a resetting voltage Vrs is applied to the via $Via_x$, and the lower metal layer $M_x$ is coupled to the ground voltage Vg, the reverse reading current Ir flows through the upper metal layer $M_{x+1}$ to the lower metal layer $M_x$.

In FIG. 7, the resistive random access memory unit MU in the left side can be divided into an upper portion and a lower portion. In the upper portion, a part of the oxygen ions ($O^{2-}$) is effected by the Joule Heating to combine and offset with the oxygen vacancies. In the lower portion, the oxygen ions are substantially offset with the oxygen vacancies via the electron depletion and the Joule Heating, therefore, the oxygen vacancies remain in the upper portion of the gap G1, and forms the one-way conduction state (as shown in the right side of FIG. 7).

Figure 8B:
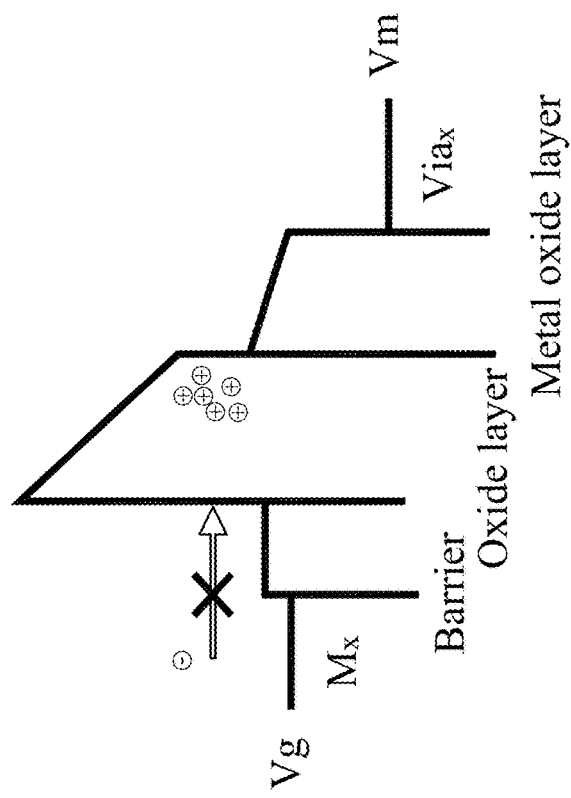
FIG. 8B shows an energy band gap schematic view of the resistive random access memory unit with one-way conduction characteristic of FIG. 6A, while the resistive random access memory unit with one-way conduction characteristic is read reversely.
Figure 8A:
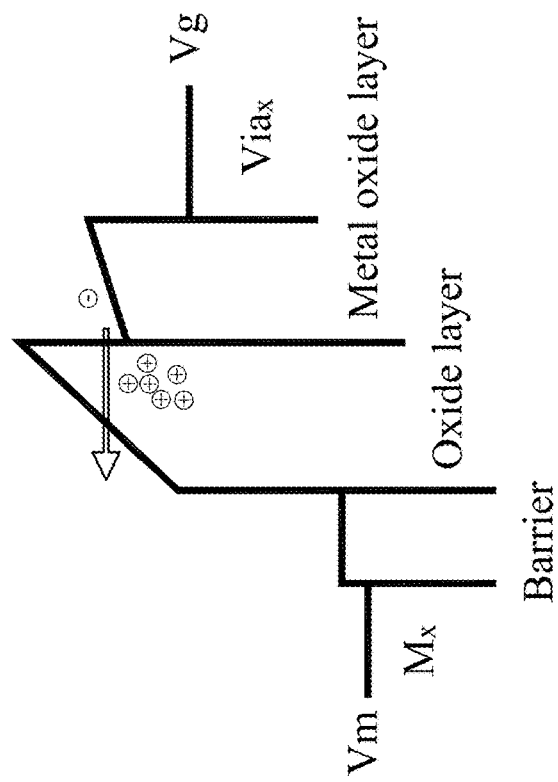
FIG. 8A shows an energy band gap schematic view of the resistive random access memory unit with one-way conduction characteristic of FIG. 6A, while the resistive random access memory unit with one-way conduction characteristic is read forwardly.

Please refer to FIG. 7, FIG. 8A and FIG. 8B. FIG. 8A shows an energy band gap schematic view of the resistive random access memory unit MU with one-way conduction characteristic of FIG. 6A, while the resistive random access memory unit MU with one-way conduction characteristic is read forwardly. FIG. 8B shows an energy band gap schematic view of the resistive random access memory unit MU with one-way conduction characteristic of FIG. 6A, while the resistive random access memory unit MU with one-way conduction characteristic is read reversely. In FIG. 8A and FIG. 8B, the gap G1 of the resistive random access memory unit MU at the one-way conduction state includes a barrier and an oxide layer with oxygen vacancy. A metal oxide layer is between the via $Via_x$ and gap G1. The oxide layer can be SiOx with lower dielectric coefficient, and the metal oxide layer can be TaON or TaN. Due to the oxygen vacancies only remaining in a side, which is near the via $Via_x$, of the oxide layer, the electrode (e) moves toward the lower metal layer $M_x$ from the via $Via_x$, while the resistive random access memory unit MU is read forwardly (the reading voltage Vm is applied to the lower metal layer $M_x$), and the electrode break the oxide layer via the oxygen vacancies. Thus, the resistive random access memory unit MU becomes conductive, as shown in FIG. 8A. The electrode (e) moves from the lower metal layer $M_x$ toward the via $Via_x$, while the resistive random access memory unit MU is read reversely (the reading voltage Vm is applied to the via $Via_x$), the electrode moves to the oxide layer, and the oxygen vacancies remaining in the insulation oxide layer cannot combine with the electrode. Thus, when the resistive random access memory unit MU is not conductive, while being read reversely.

Figure 9:
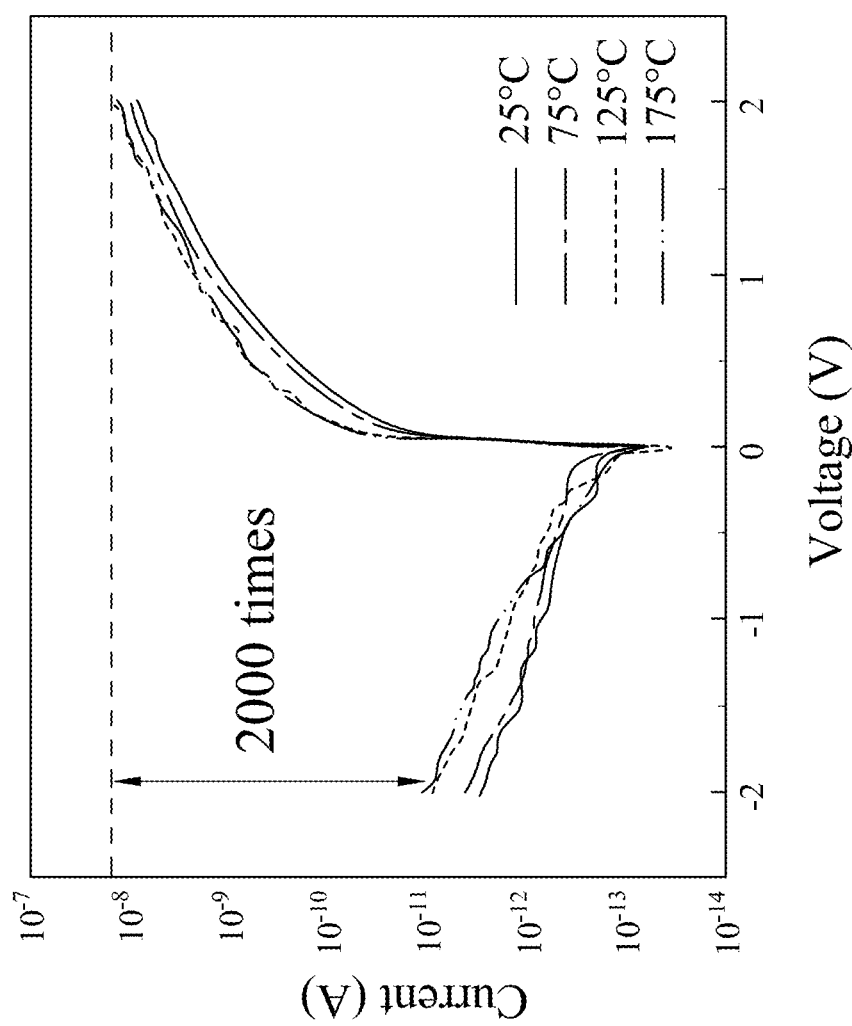
FIG. 9 shows a voltage-current characteristic schematic view of the resistive random access memory unit with one-way conduction characteristic of FIG. 6A corresponding to different temperatures.
Figure 10:
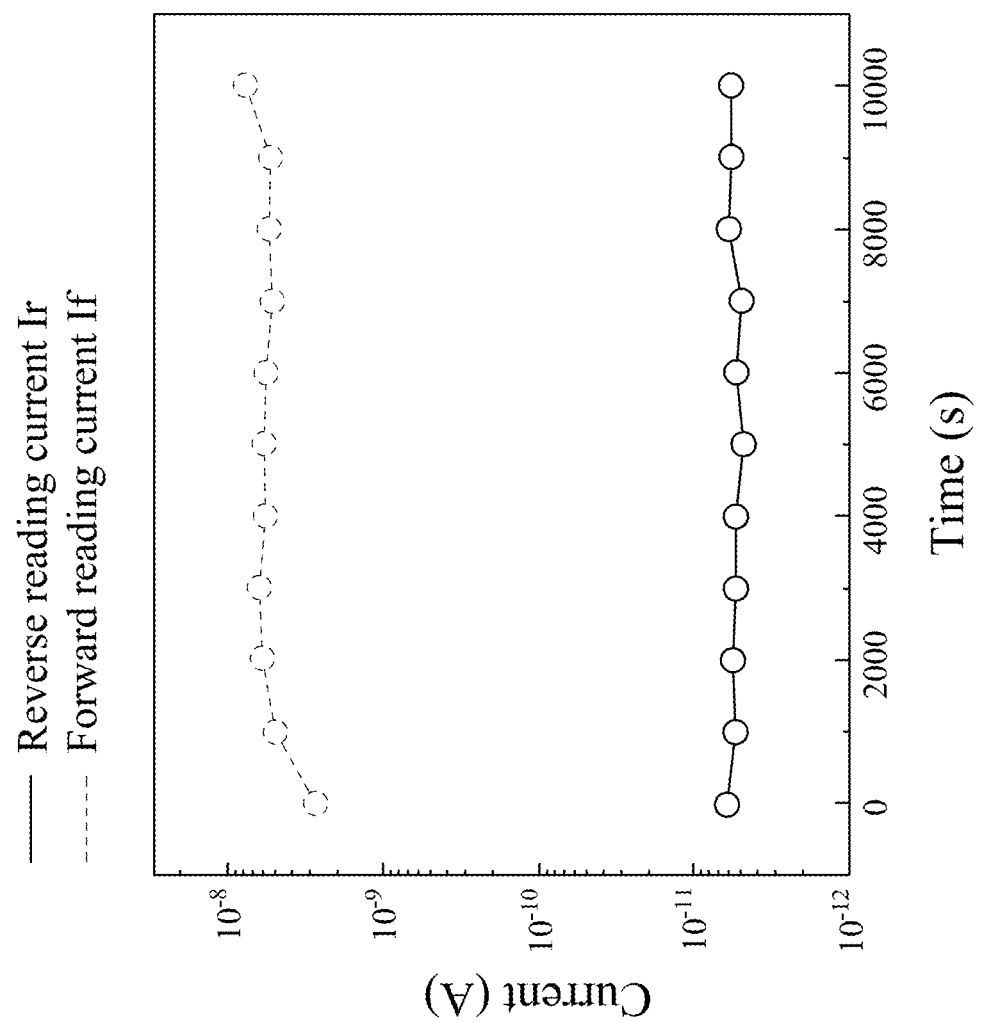
FIG. 10 shows a current schematic view of the resistive random access memory unit with one-way conduction characteristic of FIG. 6A, while the resistive random access memory unit with one-way conduction characteristic is under a stability test.

Please refer to FIG. 6A, FIG. 9 and FIG. 10. FIG. 9 shows a voltage-current characteristic schematic view of the resistive random access memory unit MU with one-way conduction characteristic of FIG. 6A corresponding to different temperatures. FIG. 10 shows a current schematic view of the resistive random access memory unit MU with one-way conduction characteristic of FIG. 6A, while the resistive random access memory unit MU with one-way conduction characteristic is under a stability test. FIG. 9 shows the current corresponding to the reading voltage Vm between $-2$ V and 2V in 25° C., 75° C., 125° C., 175° C. In FIG. 9, when the temperature is between 25° C. to 175° C., all of the forward reading currents If of the resistive random access memory unit MU with one-way conduction characteristic are at least greater than 2000 times of the reverse reading current Ir. FIG. 10 shows a variation between the forward reading current If and the reverse reading current Ir in 10k seconds, when the reading voltage Vm is 1 V. Thus, the resistive random access memory unit MU with one-way conduction characteristic of the present disclosure has a high temperature resistance characteristic and a one-way conduction characteristic (the forward reading current If is greater than the reverse reading current Ir) in a long time.

According to the aforementioned embodiments and examples, the advantages of the present disclosure are described as follows.

1. The resistive random access memory unit with one-way conduction characteristic of the present disclosure can have the one-way conduction characteristic by enlarging the gap between the via and the lower metal layer.

2. The fabricating method of the resistive random access memory unit with one-way conduction characteristic of the present disclosure can be used as a diode structure in a memory array to ensure that the memory unit can be read, written and clear in single direction, and avoid a sneak path current occurred by being read in two directions, therefore, the reading accuracy and stability of the memory array can be increased.

3. The resistive random access memory unit with one-way conduction characteristic of the present disclosure can configure the metal layer, the via and the metal layer as the upper metal layer, the via and the lower metal layer of the resistive random access memory unit to obtain an obvious one-way conduction characteristic.

4. The resistive random access memory unit with one-way conduction characteristic of the present disclosure has a high temperature resistance characteristic and a one-way conduction characteristic (the forward reading current is greater than the reverse reading current) in a long time.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A fabricating method of a resistive random access memory unit with one-way conduction characteristic, comprising:
    performing an initializing step, wherein the initializing step comprises providing the resistive random access memory unit, an original state of the resistive random access memory unit is a high resistive state, the resistive random access memory unit comprises an upper metal layer, a via and a lower metal layer, the upper metal layer is connected to the via, and there is a gap between the lower metal layer and the via;
    performing a forming step, wherein the forming step comprises applying a setting voltage on the lower metal layer, and coupling the upper metal layer to a ground voltage to transform the resistive random access memory unit from the high resistive state to a low resistive state; and performing a reverse resetting step, wherein the reverse resetting step comprises coupling the lower metal layer to the ground voltage and applying a resetting voltage to the upper metal layer to transform the resistive random access memory unit from the low resistive state to a one-way conduction state;

wherein when a reading voltage between the lower metal layer and the upper metal layer is greater than 0 V, a forward reading current flows through the lower metal layer, the via and the upper metal layer in sequence, when the reading voltage between the lower metal layer and the upper metal layer is less than 0 V, a reverse reading current flows through the upper metal layer, the via and the lower metal layer in sequence, the forward reading current is greater than the reverse reading current, and the forward reading current is less than 3000 times of the reverse reading current.

2. The fabricating method of the resistive random access memory unit with one-way conduction characteristic of claim 1, wherein the gap is greater than or equal to 26 nm, and less than or equal to 30 nm.

3. The fabricating method of the resistive random access memory unit with one-way conduction characteristic of claim 1, wherein the setting voltage is greater than or equal to 4 V and less than or equal to 6 V, and the resetting voltage is greater than or equal to 2 V and less than or equal to 3 V.

4. The fabricating method of the resistive random access memory unit with one-way conduction characteristic of claim 1, wherein the resistive random access memory unit is stacked on a Fin Field-Effect Transistor (FinFET) of a Complementary Metal-Oxide-Semiconductor (CMOS), the upper metal layer is a 10th metal layer of the CMOS, and the lower metal layer is a 9th metal layer of the CMOS.

5. The fabricating method of the resistive random access memory unit with one-way conduction characteristic of claim 1, wherein the forming step comprises:
    performing a current limiting step, wherein the current limiting step comprises electrically connecting the resistive random access memory unit to a current limiting unit, when an output current of the resistive random access memory unit is greater than an upper limiting current, the current limiting unit provides the upper limiting current;
    wherein the upper limiting current is less than or equal to 20 µA.

6. The fabricating method of the resistive random access memory unit with one-way conduction characteristic of claim 1, wherein the forward reading current is greater than 2000 times of the reverse reading current, and is less than 2500 times of the reverse reading current.

7. A resistive random access memory unit with one-way conduction characteristic, comprising:
    an upper metal layer;
    a via connected to the upper metal layer; and
    a lower metal layer, wherein there is a gap between the lower metal layer and the via;
    wherein when a setting voltage is applied to the lower metal layer and the upper metal layer is coupled to a ground voltage, the resistive random access memory unit is transformed from a high resistive state to a low resistive state;
    wherein when the lower metal layer is coupled to the ground voltage and a resetting voltage is applied to the upper metal layer, the resistive random access memory unit is transformed from the low resistive state to a one-way conduction state;
    wherein when a reading voltage between the lower metal layer and the upper metal layer is greater than 0 V, a forward reading current flows through the lower metal layer, the via and the upper metal layer in sequence, when the reading voltage between the lower metal layer and the upper metal layer is less than 0 V, a reverse reading current flows through the upper metal layer, the via and the lower metal layer in sequence, the forward reading current is greater than the reverse reading current, and the forward reading current is less than 3000 times of the reverse reading current.

8. The resistive random access memory unit with one-way conduction characteristic of claim 7, wherein the gap is greater than or equal to 26 nm, and less than or equal to 30 nm.

9. The resistive random access memory unit with one-way conduction characteristic of claim 7, wherein the setting voltage is greater than or equal to 4 V and less than or equal to 6 V, and the resetting voltage is greater than or equal to 2 V and less than or equal to 3 V.

10. The resistive random access memory unit with one-way conduction characteristic of claim 7, wherein the resistive random access memory unit is stacked on a Fin Field-Effect Transistor (FinFET) of a Complementary Metal-Oxide-Semiconductor (CMOS), the upper metal layer is a 10th metal layer on the CMOS, and the lower metal layer is a 9th metal layer on the CMOS.

11. The resistive random access memory unit with one-way conduction characteristic of claim 7, wherein the resistive random access memory unit is electrically connected to a current limiting unit, when an output current of the resistive random access memory unit is greater than an upper limiting current, the current limiting unit provides the upper limiting current;
    wherein the upper limiting current is less than or equal to 20 µA.

12. The resistive random access memory unit with one-way conduction characteristic of claim 7, wherein the forward reading current is greater than 2000 times of the reverse reading current, and is less than 2500 times of the reverse reading current.

* * * * *